United States Patent
Eitan

(10) Patent No.: US 8,008,709 B2
(45) Date of Patent: *Aug. 30, 2011

(54) NROM FABRICATION METHOD

(75) Inventor: Boaz Eitan, Hofit (IL)

(73) Assignee: Spansion Israel Ltd, Netanya (IL)

( * ) Notice: Subject to any disclaimer, the term of this patent is extended or adjusted under 35 U.S.C. 154(b) by 100 days.

This patent is subject to a terminal disclaimer.

(21) Appl. No.: 12/005,323

(22) Filed: Dec. 27, 2007

(65) Prior Publication Data

US 2008/0135911 A1     Jun. 12, 2008

Related U.S. Application Data

(63) Continuation of application No. 11/979,183, filed on Oct. 31, 2007, which is a continuation of application No. 10/961,398, filed on Oct. 12, 2004, which is a continuation of application No. 09/966,754, filed on Oct. 1, 2001, now Pat. No. 6,803,279, which is a continuation of application No. 09/365,369, filed on Jul. 30, 1999, now Pat. No. 6,297,096, which is a continuation of application No. 08/873,384, filed on Jun. 11, 1997, now Pat. No. 5,966,603.

(51) Int. Cl.
*H01L 29/792* (2006.01)

(52) U.S. Cl. .................. 257/324; 257/E29.309

(58) Field of Classification Search .......... 257/324, 257/314–316, E29.309
See application file for complete search history.

(56) References Cited

U.S. PATENT DOCUMENTS

| | | |
|---|---|---|
| 4,017,888 A | 4/1977 | Christie et al. |
| 4,151,021 A | 4/1979 | McElroy |
| 4,173,766 A | 11/1979 | Hayes |
| 4,173,791 A | 11/1979 | Bell |
| 4,257,832 A | 3/1981 | Schwabe et al. |

(Continued)

FOREIGN PATENT DOCUMENTS

EP     0751560     1/1997

(Continued)

OTHER PUBLICATIONS

Chan, et al, "A True-Single Translator Oxide-Nitride-Oxide EEPROM Device", IEEE Electron Device Letters, vol. ED1-8, Nov. 3, Mar. 1987.

(Continued)

*Primary Examiner* — Nathan W Ha
(74) *Attorney, Agent, or Firm* — Eitan Mehulal Law Group

(57) ABSTRACT

A method of fabricating an oxide-nitride-oxide (ONO) layer in a memory cell to retain charge well in the nitride layer includes the steps of forming a bottom oxide layer on a substrate, depositing a nitride layer and oxidizing a top oxide layer, thereby causing oxygen to be introduced into the nitride layer. Another method includes the steps of forming a bottom oxide layer on a substrate, depositing a nitride layer and oxidizing a portion of a top oxide layer, thereby causing oxygen to be introduced into the nitride layer and depositing a remaining portion of the top oxide layer, thereby assisting in controlling the amount of oxygen introduced into the nitride layer. A further method includes the steps of forming a bottom oxide layer on a substrate, depositing a nitride layer, depositing a portion of a top oxide layer and oxidizing a remaining portion of the top oxide layer, thereby causing oxygen to be introduced into the nitride layer.

1 Claim, 4 Drawing Sheets

U.S. PATENT DOCUMENTS

| | | | |
|---|---|---|---|
| 4,306,353 A | 12/1981 | Jacobs et al. | |
| 4,342,149 A | 8/1982 | Jacobs et al. | |
| 4,360,900 A | 11/1982 | Bate | |
| 4,382,827 A | 5/1983 | Romano-Moran et al. | |
| 4,471,373 A | 9/1984 | Simizu et al. | |
| 4,521,796 A | 6/1985 | Rajkanen et al. | |
| 4,527,257 A | 7/1985 | Cricchi | |
| 4,667,217 A | 5/1987 | Janning | |
| 4,701,776 A | 10/1987 | Pertegos et al. | |
| 4,742,492 A | 5/1988 | Smayling et al. | |
| 4,743,564 A | 5/1988 | Sato et al. | |
| 4,754,314 A | 6/1988 | Scott et al. | |
| 4,769,340 A | 9/1988 | Chang et al. | |
| 4,870,470 A | 9/1989 | Bass, Jr. et al. | |
| 5,104,819 A | 4/1992 | Freiberger et al. | |
| 5,159,570 A | 10/1992 | Mitchell et al. | |
| 5,168,334 A | 12/1992 | Mitchell et al. | |
| 5,172,338 A | 12/1992 | Mehrorta et al. | |
| 5,175,120 A | 12/1992 | Lee | |
| 5,266,502 A * | 11/1993 | Okada et al. | 438/766 |
| 5,268,590 A | 12/1993 | Pfiester et al. | |
| 5,311,049 A | 5/1994 | Tsuruta | |
| 5,319,230 A * | 6/1994 | Nakao | 257/325 |
| 5,324,675 A | 6/1994 | Hayabuchi | |
| 5,349,221 A | 9/1994 | Shimoji | |
| 5,418,176 A | 5/1995 | Yang et al. | |
| 5,424,567 A | 6/1995 | Chen | |
| 5,426,605 A | 6/1995 | Van Berkel et al. | |
| 5,436,481 A | 7/1995 | Egawa et al. | |
| 5,467,308 A | 11/1995 | Chang et al. | |
| 5,477,499 A | 12/1995 | Van Buskirk et al. | |
| 5,496,753 A | 3/1996 | Sakurai et al. | |
| 5,511,020 A * | 4/1996 | Hu et al. | 365/185.28 |
| 5,578,855 A | 11/1996 | Gaffur et al. | |
| 5,629,224 A | 5/1997 | Rostoker et al. | |
| 5,633,202 A | 5/1997 | Brigham et al. | |
| 5,661,060 A | 8/1997 | Gill et al. | |
| 5,663,086 A | 9/1997 | Rostoker et al. | |
| 5,714,399 A | 2/1998 | Hisatomi et al. | |
| 5,751,037 A | 5/1998 | Aozawa et al. | |
| 5,768,192 A | 6/1998 | Eitan | |
| 5,812,449 A | 9/1998 | Song | |
| 5,825,686 A | 10/1998 | Schmitt-Landsiedel et al. | |
| 5,836,772 A | 11/1998 | Chang et al. | |
| 5,866,458 A | 2/1999 | Lee | |
| 5,869,590 A | 2/1999 | Clark et al. | |
| 5,910,016 A | 6/1999 | Kazerounian et al. | |
| 5,925,907 A | 7/1999 | Hazama | |
| 5,926,730 A | 7/1999 | Hu et al. | |
| 5,953,254 A * | 9/1999 | Pourkeramati | 365/185.26 |
| 5,966,603 A | 10/1999 | Eitan | |
| 6,046,494 A | 4/2000 | Brigham et al. | |
| 6,063,666 A | 5/2000 | Chang et al. | |
| 6,093,943 A * | 7/2000 | Ikemasu et al. | 257/306 |
| 6,163,050 A | 12/2000 | Hisatomi et al. | |
| 6,297,096 B1 | 10/2001 | Boaz | |
| 6,330,190 B1 * | 12/2001 | Wang et al. | 365/185.28 |
| 6,346,442 B1 | 2/2002 | Aloni et al. | |
| 6,614,070 B1 * | 9/2003 | Hirose et al. | 257/316 |
| 6,784,116 B2 * | 8/2004 | Tanabe et al. | 438/773 |
| 6,803,279 B2 | 10/2004 | Eitan | |
| 2008/0073702 A1 | 3/2008 | Eitan | |
| 2008/0099832 A1 | 5/2008 | Eitan | |

FOREIGN PATENT DOCUMENTS

| | | |
|---|---|---|
| EP | 1 073 120 | 1/2001 |
| JP | 7193151 | 7/1995 |
| WO | WO8100790 | 3/1981 |

OTHER PUBLICATIONS

Eitan, et al, "Hot-Electron Injection into the Oxide in n-Channel MOS Devices", IEEE Transactions on Electron Devices, vol. ED-28, No. 3, Mar. 1981.

Paulsen, et al, "Observation of near interface oxide traps with charge pumping technique", IEEE Electron Device Letters, vol. 13, No. 12, Dec. 1992.

Pan, Cheng-Sengh, et al, "A Scaling Methodology for Oxide-Nitride-Oxide Interpoly Dielectric for EPROM Applications", IEEE Transactions on Electron Devices, vol. 37, No. 6, Jun. 1990.

* cited by examiner

NROM FABRICATION METHOD

CROSS-REFERENCE TO RELATED APPLICATIONS

This application is a continuation application of U.S. patent application Ser. No. 11/979,183, filed Oct. 31, 2007 which is a continuation application of U.S. patent application Ser. No. 10/961,398, filed Oct. 12, 2004 which is a continuation application of U.S. patent application Ser. No. 09/966,754, filed Oct. 1, 2001 now U.S. Pat. No. 6,803,279 which is a continuation application of U.S. patent application Ser. No. 09/365,369, filed Jul. 30, 1999 now U.S. Pat. No. 6,297,096, which is a continuation-in-part application of U.S. patent application Ser. No. 08/873,384, filed Jun. 11, 1997 now U.S. Pat. No. 5,966,603, all of which are hereby incorporated by reference.

FIELD OF THE INVENTION

The present invention relates generally to methods of fabrication of nitride read only memory (NROM) cells and arrays.

BACKGROUND OF THE INVENTION

FIG. 1, to which reference is made, illustrates a typical prior art NROM cell. This cell includes a substrate 10 in which are implanted a source 12 and a drain 14 and on top of which lies an oxide-nitride-oxide (ONO) structure 16 having a layer of nitride 17 sandwiched between two oxide layers 18 and 20. On top of the ONO structure 16 lies a gate conductor 22. Between source 12 and drain 14 is a channel 15 formed under ONO structure 16.

Nitride section 17 provides the charge retention mechanism for programming the memory cell. Specifically, when programming voltages are provided to source 12, drain 14 and gate conductor 22, electrons flow towards drain 14. According to the hot electron injection phenomenon, some hot electrons penetrate through the lower section of silicon oxide 18, especially if section 18 is thin, and are then collected in nitride section 17. As is known in the art, nitride section 17 retains the received charge, labeled 24, in a concentrated area adjacent drain 14. Concentrated charge 24 significantly raises the threshold of the portion of the channel of the memory cell under charge 24 to be higher than the threshold of the remaining portion of the channel 15.

When concentrated charge 24 is present (i.e. the cell is programmed), the raised threshold of the cell does not permit the cell to be placed into a conductive state during reading of the cell. If concentrated charge 24 is not present, the read voltage on gate conductor 22 can overcome the much lower threshold and accordingly, channel 15 becomes inverted and hence, conductive.

U.S. application Ser. No. 08/861,430 filed Jul. 23, 1996 and owned by the common inventor of the present invention describes an improved NROM cell, which is programmed in one direction and read in the reverse direction.

It is noted that the threshold voltage Vth of NROM cells is generally very sensitive to the voltages Vdrain and Vgate provided on the drain 14 and on the gate 22, respectively. Furthermore, U.S. application Ser. No. 08/861,430 selects the voltages Vdrain and Vgate are selected in order to ensure that the charge trapped in a portion of the nitride layer 17 remains localized in that portion.

Read only memory cells, including a nitride layer in the gate dielectric (NROM) are described, inter alia, in U.S. Pat. No. 5,168,334 to Mitchell et al. and U.S. Pat. No. 4,173,766 to Hayes.

Mitchell et al. describe two processes to produce the NROM cells. In the first process, bit lines are first created in the substrate, after which the surface is oxidized. Following the oxidation, the ONO layers are added over the entire array. Polysilicon word lines are then deposited in rows over the ONO layers. Unfortunately, when an oxide layer is grown (typically under high temperature), the already present bit lines will diffuse to the side, an undesirable occurrence which limits the extent to which the cell size can be shrunk.

In the second process, the ONO layers are formed over the entire array first, on top of which conductive blocks of polysilicon are formed. The bit lines are implanted between the blocks of polysilicon after which the ONO layers are etched away from on top of the bit lines. Planarized oxide is then deposited between the polysilicon blocks after which polysilicon word lines are deposited. Mitchell et al. utilize a planarized oxide since such can be deposited rather than grown. Mitchell et al. cannot grow an oxide over the bit lines since such an oxidation operation would also grow oxide over the polysilicon blocks and the latter must be left with a very clean surface in order to connect with the polysilicon word lines. Unfortunately, planarized oxide is not a clean oxide nor does it seal around the edges of the ONO sections. Furthermore, the planarized oxide adds complexity and cost to the process.

Hayes et al. describe an NROM cell having only an oxide-nitride (ON) layer. The cells in the array are created by forming layers of oxide, nitride and polysilicon (the latter to produce the gate) one after another and then patterning and etching these layers to form the on cells. The uncapped nitride in each cell does not hold charge well in both the vertical and lateral directions. Due to hole and hot electron conduction within the nitride, the charge to be stored will flow vertically towards the gate covering it unless the nitride is thick and will flow laterally in the nitride in response to lateral electric fields.

SUMMARY OF THE PRESENT INVENTION

It is an object of the present invention to provide a method of fabricating NROM cells and NROM cell arrays with improved data retention.

There is therefore provided, in accordance with a preferred embodiment of the present invention, a method of fabricating an oxide-nitride-oxide (ONO) layer in a memory cell to retain charge in the nitride layer. The method includes the steps of forming a bottom oxide layer on a substrate, depositing a nitride layer and oxidizing a top oxide layer, thereby causing oxygen to be introduced into the nitride layer.

Alternatively, in accordance with a preferred embodiment of the present invention, the method includes the steps of forming a bottom oxide layer on a substrate, depositing a nitride layer, oxidizing a portion of a top oxide layer thereby causing oxygen to be introduced into the nitride layer and depositing a remaining portion of the top oxide layer, thereby assisting in controlling the amount of oxygen introduced into the nitride layer.

Further, in accordance with a preferred embodiment of the present invention, the method includes the steps of forming a bottom oxide layer on a substrate, depositing a nitride layer, depositing a portion of a top oxide layer and oxidizing a remaining portion of the top oxide layer, thereby causing oxygen to be introduced into the nitride layer.

There is provided, in accordance with a preferred embodiment of the present invention, a method for improving the charge retention in a nitride layer of a memory chip. The method includes the steps of depositing a nitride layer and introducing oxygen into the nitride layer.

Alternatively, in accordance with a preferred embodiment of the present invention, the method includes the steps of depositing a nitride layer, controlling the thickness of the deposited nitride layer and introducing oxygen into the nitride layer.

Further, in accordance with a preferred embodiment of the present invention, the method includes the steps of forming a bottom oxide layer on a substrate, depositing a nitride layer at a thickness approximate to the final thickness after fabrication, depositing a portion of a top oxide layer and oxidizing a remaining portion of the top oxide layer, thereby assisting in controlling the introduction of oxygen into the nitride layer.

BRIEF DESCRIPTION OF THE DRAWINGS

The present invention will be understood and appreciated more fully from the following detailed description taken in conjunction with the drawings in which.

DETAILED DESCRIPTION OF PREFERRED EMBODIMENTS

Figure 1:
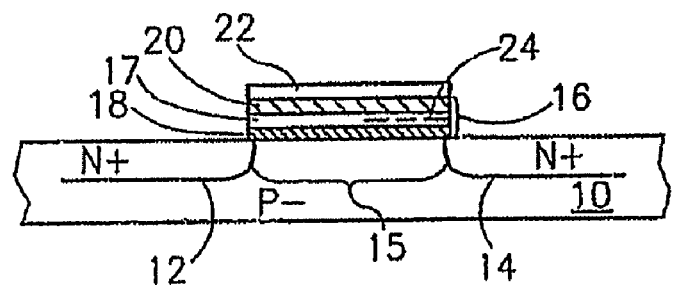
FIG. 1 is a schematic illustration of a prior art NROM memory cell.

Reference is now made to FIGS. 2, 3A, 3B, 3C, 4, 5, 6A and 6B, which illustrate the NROM fabrication method of the present invention. Similar reference numerals herein refer to similar elements. It is noted that the present invention covers the fabrication of the entire chip, which includes the NROM memory array portion and the complementary metal oxide semiconductor (CMOS) periphery devices.

In the following discussion, the process of etching a layer, which includes placing photoresist on the layer, placing a mask on the photoresist, etching wherever the mask is not and removing the photoresist, will not be detailed.

The method begins with a standard complementary metal oxide semiconductor (CMOS) initial process for preparing the substrate 10 including N well formation and field oxide formation. A screen oxide layer is then grown (not shown) on substrate 10 after which it is removed, typically with a wet etch thereby to remove any residual nitride at the edge of the field. A typical thickness of the screen oxide layer is 200-400 Å

Substrate 10 is then overlaid with an ONO layer. A bottom oxide layer 30 is grown over substrate 10 typically to a thickness of between 50 Å and 150 Å in a low temperature oxidation operation. A typical oxidation temperature is about 800° C. but it can vary between 750-1000° C. A preferred thickness of the bottom oxide layer 30 is 80 Å.

A nitride layer 32 is then deposited over bottom oxide layer 30 to a thickness of between 20 Å and 150 Å where a preferred thickness is as thin as possible, such as 10 Å-50 Å. Applicant notes that a thin layer of the nitride prohibits lateral movement of the charge retained within the nitride, and hence, it is beneficial to control the thickness of nitride layer 32.

Top oxide 34 is then produced either through oxidation of the nitride (i.e. growing of the oxide), or by deposition or by a combination thereof. It is noted that top oxide 34 consumes nitride during oxidation, where typically half of the oxide thickness comes from the consumed nitride. Thus, if it is desired to have a top oxide which is 100 Å thick, the nitride layer 32 should be at least 50 Å thicker than the final desired nitride thickness, with this extra nitride being for consumption in the formation of the top oxide layer.

It is also noted that, during oxidation of top oxide layer, some of the oxygen is introduced into the non-consumed nitride layer.

Ultimately, as is described hereinbelow, nitride layer 32 is transformed into nitride section 17, which provides the charge retention mechanism for the memory cell. Nitride, particularly due to its structure, traps the electrons, which are introduced into nitride section 17. Oxygen however, is a better insulator than nitride and helps to minimize the lateral movement of electrons in nitride layer 32. It is thus an important element for effective retention of the charge. It is therefore noted that one of the factors effecting the quality of retention ability of nitride section 17 is the concentration of oxygen within nitride layer 32. The oxygen concentration is defined as the percentage of oxygen atoms relative to the nitride atoms, irrespective of the type of molecule in which the oxygen atoms are found. The concentration can range from a low of 10% to a high of 80%.

Hence, in order to produce a retention layer, which provides effective charge retention, it is recommended to introduce a high percentage of oxygen into the nitride. Nonetheless, if the oxi-nitride composition is too oxygen rich, even though nitride is essentially an oxidation barrier, a run-away situation is produced whereby nitride layer 32 absorbs too much oxygen and ceases to act as a barrier for oxygen diffusion. In such an instance, the oxygen introduced into the oxygen rich nitride layer 32 reaches the silicone oxide layer 18, and become SIO2.

In summary, in order to produce a nitride section 17 with maximum retention qualities, it is desirable to make nitride layer 32 as thin as possible, with the maximum oxygen concentration, without inducing a run-away situation. Consequently, it is critical to control the fabrication the ONO structure, and specifically, the manner in which the top oxide 34 is produced.

The top oxide is typically of a thickness of between 50 Å and 150 Å. Three alternative operations for creating a top oxide 34 of 100 Å are described hereinbelow.

The first method involves depositing nitride layer 32 of approximately 150-160 Å, growing 120-130 Å of top oxide 34, (which includes consuming 60-65 Å of nitride layer 32) and removing 20-30 Å of oxide layer 34 during cleaning. Since a large portion of nitride layer 32 is consumed, it is difficult to control the amount of oxygen introduced into nitride layer 32. Thus, in order to avoid a possibility of run-away conditions in the nitride layer, it is essential to "leave" a thicker nitride layer. This alternative produces a thicker nitride layer; however it provides for high introduction of oxygen into the nitride and is a simple process to perform.

The second method involves depositing nitride layer 32 at a thickness of approximately 60 Å, growing a thin layer of oxide layer 34 (approximately 40 Å) while consuming about 20 Å of nitride, depositing 80-90 Å and removing 20-30 Å during cleaning. Since depositing oxide is a quicker process than growing oxide, this alternative is quicker than the first alternative and it offers marginally better control over the amount of oxygen introduced into nitride layer 32

It is noted that the longer the oxidation process continues the greater the effect on previously produced layers. Therefore, in order diminish the effect on previous layers, it is desirable to create the top oxide layer as quickly as possible.

The third method involves depositing nitride layer 32 at a thickness close to the preferred final thickness, such as 20 Å, depositing 100-110 Å of oxide, growing 2-5 Å of oxide and removing 20-30 Å of oxide during cleaning. When growing oxide after it has been deposited, the deposited layer acts as a barrier between the growing oxide and nitride layer 32. Hence, the oxygen is introduced slowly into nitride layer 32. This alternative is slower than the previous alternatives; however, it provides a thin nitride layer and a more controlled manner for regulating the introduction of oxygen into the nitride layer.

The process by which the nitride and top oxide layers are generated depends on the ability of the manufacturing facility to control the thickness and composition of the layers of the ONO structure.

Figure 2:
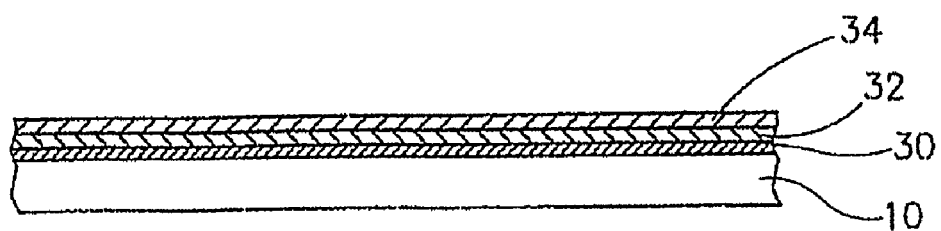
FIG. 2 is a schematic illustration of the NROM memory chip after an oxide-nitride-oxide layer has been laid down.
Figure 3A:
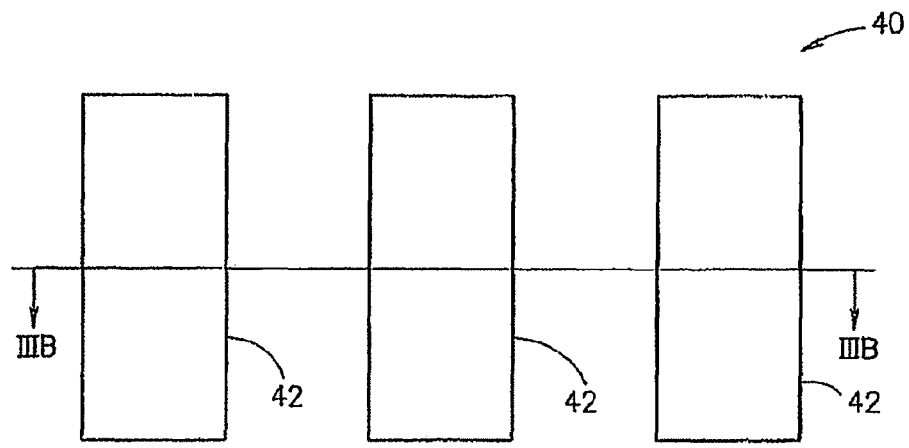
FIG. 3A is a schematic illustration in top view of a bit line implant mask.
Figure 3B:
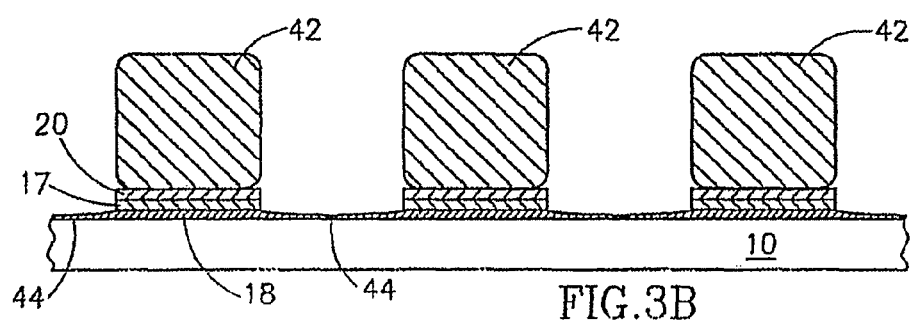
FIG. 3B a cross section of a portion of the memory array of the chip of FIG. 2 after the mask of FIG. 3A is laid down and after etching away the exposed portions of the ONO layer leaving part of the bottom oxide layer.
Figure 3C:
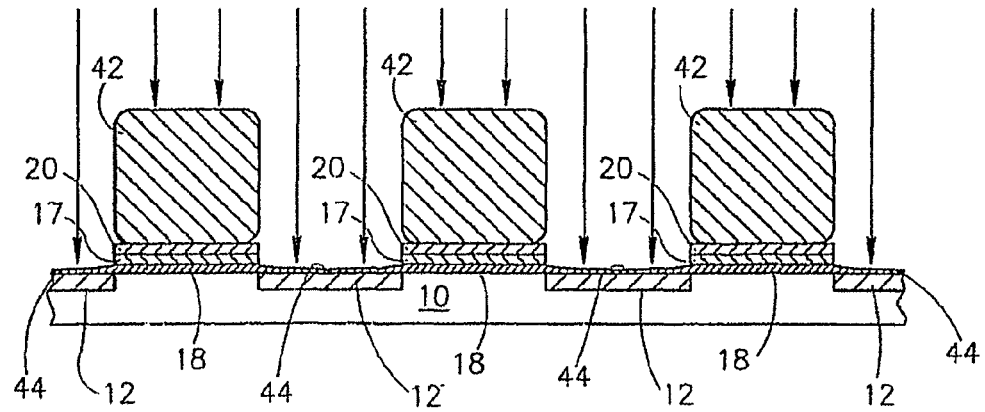
FIG. 3C shows the cross section of FIG. 3B after an implant of an impurity to form the bit lines in the memory array portion of the chip of FIG. 3B.
Figure 4:
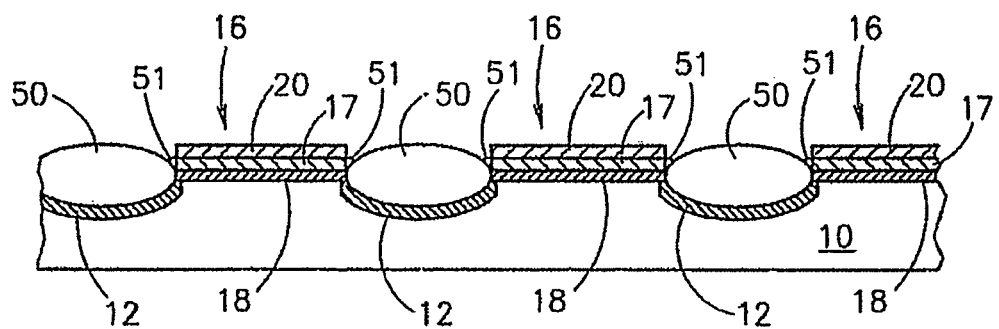
FIG. 4 shows in cross section the memory array portion of the chip of FIG. 3C after oxidation of the bit lines.

At this point, the entire substrate 10 is covered with an ONO layer, as shown in FIG. 2. The next step involves depositing a bit line mask 40 (typically photoresist 42 patterned in a well known manner), whose layout within the memory array portion of the chip is shown in FIG. 3A, to create the bit lines, forming lines of sources and lines of drains. FIG. 3B illustrates a portion of the resultant chip within the memory array portion with the photoresist 42 patterned. FIG. 3B is a side view (similar to FIG. 2) with the columns 42 of the bit line mask in place. Photoresist columns 42 define the areas where the bit lines are not to be implanted (i.e. the locations of the channels 15 (FIG. 1)).

Prior to implanting the bit lines, the top oxide and nitride layers 32 and 34, respectively, are etched away from the areas between columns 42. The etch operation is typically a dry etch which might also etch a portion 44 of bottom oxide layer 30 which is between columns 42, leaving portion 44 with a predetermined thickness, such as 50 Å. The etch operation produces oxide sections 18 and 20 and nitride section 17 under each column 42.

After the etch operation, bit lines 12 are implanted (FIG. 3C) in the areas between columns 42. A typical implant might be 2-4×1015/cm2 of Arsenic at 50 Kev. It will be appreciated that this is a self-aligned implant in which the bit lines are self-aligned to the ONO structures.

The photoresist layer 42 is then removed and bit line oxides 50 (FIG. 4) are then thermally grown over the bit lines 12 in an oxidation operation. At the same time, side oxides 51, typically of 30 Å, are grown along the sides of nitride layers 17 to improve data retention within the nitride layers. The oxidation typically occurs in the range of 800° C. to 950° C. but preferably at the lower side of this range to minimize the diffusion of the bit line impurity while maximizing the thickness of the thermal oxide. This lowers the bit line capacitance. The oxidation temperature also activates the implanted bit line impurities.

Thus the typical oxidation process is a low temperature oxidation of about 800° C. which, on a P-substrate, normally is continued for a time sufficient to grow the equivalent of 100 Å of thermal oxide. On the chip of the present invention, however, top oxide sections 20 will not significantly increase in thickness during the bit line oxidation due to the close presence of nitride sections 18 while oxide layer 44 over the bit lines 12 will increase significantly due to the presence of Arsenic in the bit lines 12. The result is that the bit line oxides 50 are typically very thick, such as 500 Å thick, thereby lowering the bit line capacitance.

It will be appreciated that the present invention separates the creation of bottom oxide sections 18 (and thus, of the entire ONO structure 16) from the creation of bit line oxides 50. Bottom oxide sections 18 are created over the entire array as part of creating the ONO structures. Bit line oxides 50 are created during the bit line oxidation operation and this oxidation does not significantly affect the oxide layers in the ONO structures. Furthermore, bit line oxides 50 are self-aligned to the ONO structures and, since the oxidation operation is at a relatively low temperature, bit lines 12 do not significantly diffuse into substrate 10 during the oxidation operation.

Figure 5:
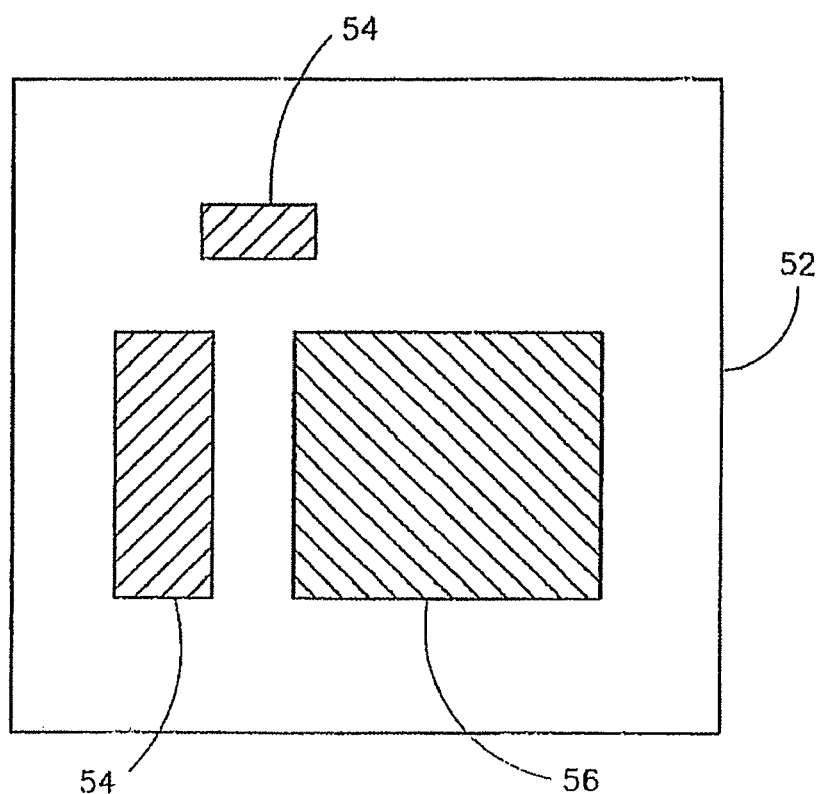
FIG. 5 is a schematic illustration of an ONO protect mask for the memory array and periphery sections of the chip.

It will further be appreciated that the ONO layers have been laid down on the entire chip and thus, are present in the periphery. In accordance with a preferred embodiment of the present invention, the ONO layers can be utilized as thick gate oxides in the portions of the periphery where thicker oxides are needed. Thus, if two gate dielectric thicknesses are required in the periphery, the present invention provides one gate dielectric using the ONO layers and the second, thinner gate dielectric can be produced in a separate gate oxide production step. Furthermore, as shown in FIG. 5, a single mask 52 can be utilized to mark both the locations 54 of the thick gate oxides as well as to protect the memory array (area 56) while etching and oxidizing the periphery.

Mask 52 can be utilized in one of two alternative ways. In the first embodiment, a threshold level adjustment implant for the peripheral transistors is performed after mask 52 is laid down and patterned. This provides the periphery with a threshold level different from that of the memory array area 56. In the second embodiment, the threshold level adjustment implant is performed on the entire chip prior to laying down mask 52. In this embodiment, mask 52 serves only to mark the locations where the ONO layers are to be removed.

Specifically, in the first embodiment, after mask 52 is laid down, the threshold voltage level adjustment is performed. This procedure involves implanting boron through the ONO layers into the portions of the periphery of the chip not covered by mask 52. Typically, there are two adjustment steps, one each for the n-channel and p-channel transistors. It will be appreciated that, in accordance with a preferred embodiment of the present invention, the adjustment implant is performed through the ONO layers since they are not yet capped and thus, do not block the implant operation. It will further be appreciated that, for the threshold adjustment procedure, the to-be-removed ONO layers act as a sacrificial oxide (e.g. an oxide grown for an implant operation and immediately thereafter removed).

Following the threshold voltage adjustment procedure, the ONO layers on the unmasked portions of the chip are removed. Initially, a dry oxide etch is utilized to remove top oxide 34 and nitride 32 layers after which a wet etch is utilized to remove bottom oxide layer 30. Following removal of mask 52, a gate oxide (not shown) of typically 100-150 Å is thermally grown over the entire chip. Due to the presence of nitride in the memory array, the gate oxide step does not significantly affect the thickness of top oxide 20. However, this step creates gate oxides for the transistors in the periphery.

It will be appreciated that the gate oxide thickness is thus independent of the thicknesses of the bit line oxide 50 and top oxide 20.

In a second embodiment, mask 52 is laid down after the gate and threshold voltage level adjustment procedure is performed. Thus, the memory array portion of the chip also receives threshold level adjustments. With mask 52 in place, the ONO layers on the unmasked portions of the chip are removed, as described hereinabove. Once again, the ONO layers act as a sacrificial oxide, eliminating the necessity for the additional sacrificial oxide operations.

Finally, following removal of mask 52, a gate oxide is grown over the entire array, creating gate oxides in the periphery only.

Figure 6A:
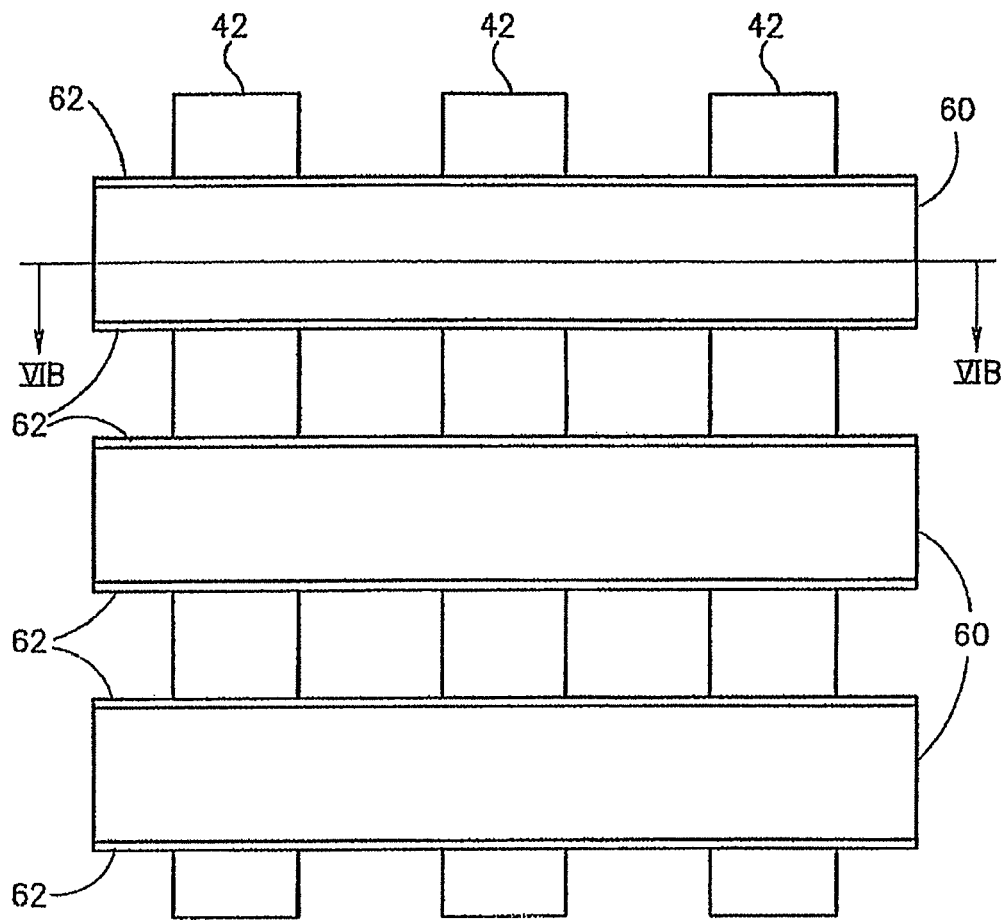
FIGS. 6A and 6B are schematic illustrations of the memory array portion of the chip of the present invention after a polysilicon or polysilicide layer 60 has been laid down, in top and side views, respectively.

Following the gate oxide growth step, a polysilicon layer, which will create word lines for the memory array portion and will create gates for the periphery transistors, is laid down over the chip. If desired, a low resistive silicide, as is known in the art, can be deposited over the polysilicon layer in order to reduce its resistivity. This creates a "polysilicide" layer. A typical total thickness of the polysilicide might be 0.3-0.4 μm. As indicated by FIG. 6A, the polysilicide or polysilicon layer is then etched using a mask into word lines 60 within the memory array. Typically the word line etch also etches at least the top oxide 20 and the nitride 17 from between the word lines 60. This improves the charge retention of the memory cells by isolating the nitride layers 17 of each transistor.

Figure 6B:
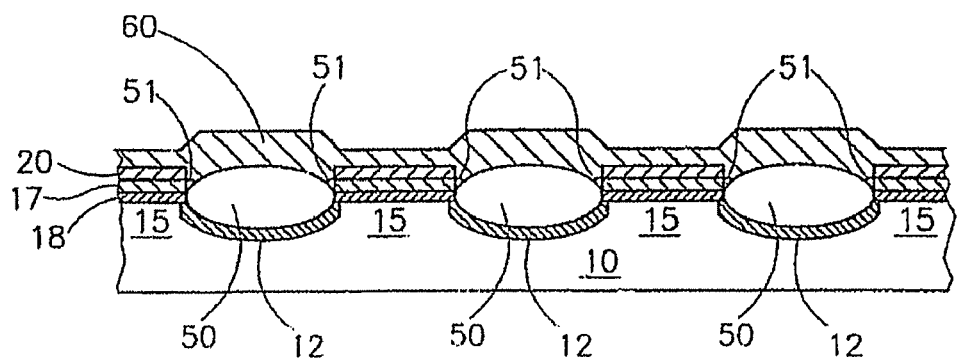

FIG. 6B illustrates one row of the resultant memory array in side view. The polysilicide or polysilicon layer 60 lies on top of the ONO structures 16 (FIG. 4), thereby forming the gates 22 (FIG. 1) of the NROM cells. Bit line oxides 50 are thick enough to isolate neighboring ONO structures 16.

The memory chip is then finished in the standard ways, including a side wall oxidation step (typically a self-aligned step), a lightly doped drain (Ldd) implant procedure into the CMOS periphery only and a spacer deposition. FIG. 6A illustrates the location of the spacers 62 as being along the sidewalls of the polysilicon word lines 60. The Ldd typically requires separate masks for the n-channel and p-channel periphery transistors.

It will be appreciated that, in the present invention, the thicknesses of the various elements of the NROM cell are generally independent of each other. For example, the thicknesses of the bottom oxide, nitride and top oxide layers are typically selected as a function of the desired operation of the memory array, the bit line oxide is independent of the thickness of bottom oxide ONO structure and the gate oxide of the periphery is independent of the other two oxide (i.e., the bit line oxide and the bottom ONO oxide) thicknesses.

It will be appreciated by persons skilled in the art that the present invention is not limited to what has been particularly shown and described hereinabove. Rather the scope of the present invention is defined only by the claims which follow:

The invention claimed is:

1. A non-volatile memory cell comprising: a silicon based dielectric charge trapping layer having a thickness of between approximately 10 and 50 angstroms, wherein said dielectric charge trapping layer includes a substantially homogenous distribution of a non-native and non-silicone based impurity, at least a portion of said layer located substantially below a gate of the cell; and an oxide layer below at least a portion of said charge trapping layer.

* * * * *